(12) United States Patent
Koyama et al.

(10) Patent No.: US 6,750,951 B2
(45) Date of Patent: Jun. 15, 2004

(54) OPTICAL APPARATUS, EXPOSURE APPARATUS, AND EXPOSURE METHOD

(75) Inventors: Motoo Koyama, Tokyo (JP); Masaki Kato, Yokohama (JP); Hidefumi Shibano, Yokohama (JP)

(73) Assignee: Nikon Corporation, Tokyo (JP)

( * ) Notice: Subject to any disclaimer, the term of this patent is extended or adjusted under 35 U.S.C. 154(b) by 154 days.

(21) Appl. No.: 09/836,430

(22) Filed: Apr. 18, 2001

(65) Prior Publication Data

US 2001/0033490 A1 Oct. 25, 2001

(30) Foreign Application Priority Data

Apr. 19, 2000 (JP) ................. P2000-118026

(51) Int. Cl.⁷ ............... G03B 27/54; G03B 27/42
(52) U.S. Cl. .................... 355/67; 355/53
(58) Field of Search ............... 355/53, 67–71; 359/580–586, 727–730; 250/548

(56) References Cited

U.S. PATENT DOCUMENTS

| | | | | |
|---|---|---|---|---|
| 5,381,210 A | * | 1/1995 | Hagiwara ................. | 355/53 |
| 5,661,837 A | | 8/1997 | Yamamoto et al. ......... | 385/115 |
| 5,805,356 A | | 9/1998 | Chiba ..................... | 359/727 |
| 5,920,431 A | * | 7/1999 | Tokuhiro et al. .......... | 359/586 |
| 6,051,842 A | * | 4/2000 | Yamamoto ................ | 250/548 |
| 6,157,497 A | | 12/2000 | Kumazawa ................ | 359/727 |
| 6,285,424 B1 | * | 9/2001 | Yoshida .................. | 349/110 |
| 6,292,616 B1 | * | 9/2001 | Tei et al. ................ | 385/140 |

FOREIGN PATENT DOCUMENTS

| | | |
|---|---|---|
| JP | 11-329935 | 11/1999 |
| JP | 2000-39557 | 2/2000 |

* cited by examiner

Primary Examiner—Henry Hung Nguyen

(57) ABSTRACT

An optical apparatus having a suppressor that suppresses the wavelength dependence, in a predetermined wavelength band, of a thin film formed on an optical surface of the optical apparatus.

24 Claims, 5 Drawing Sheets

OPTICAL APPARATUS, EXPOSURE APPARATUS, AND EXPOSURE METHOD

BACKGROUND OF THE INVENTION

1. Field of the Invention

The present invention relates to optical apparatus provided with optical thin films and, more particularly, to optical apparatus having good wavelength characteristics across a wide wavelength range. Further, the present invention concerns exposure apparatus provided with the optical apparatus, and an exposure method.

2. Related Background Art

Lenses (optical apparatus) are built in the exposure apparatus and other apparatus and it is common practice to lay an antireflection coating on the lenses in order to prevent leakage of light at the lenses. Then attempts have been made to reduce the reflectance to the smallest possible level in the working wavelength region by this antireflection coating.

SUMMARY OF THE INVENTION

The conventional optical apparatus as described above, however, had the following problem. Namely, there are not only normally incident rays but also obliquely incident rays at the position where the antireflection coating is disposed on the optical apparatus. These obliquely incident rays correspond to rays reaching the marginal part in the visual field or in the illumination field. The conventional antireflection coatings had the problem that optical energy became lower in the marginal part of the visual field or the illumination field than in the central part. In other words, the conventional antireflection coatings (or reflection-enhancing coatings) involved the problem that there occurred energy transfer unevenness such as transmittance unevenness in the entire visual field, illumination unevenness in the entire illumination field, or the like, for light of a wide wavelength region.

It is, therefore, an object of the present invention to provide optical apparatus capable of achieving good energy transfer characteristics (reflectance characteristics or transmittance characteristics) in the entire visual field or in the entire illumination field for the light of the wide wavelength region, exposure apparatus provided therewith, and an exposure method.

In order to accomplish the above object, the present invention provides optical apparatus in which a thin film with an optical characteristic having wavelength dependence is formed on an optical surface, the optical apparatus comprising a suppressor to suppress the wavelength dependence in a predetermined wavelength band.

By suppressing the wavelength dependence of the thin film such as the antireflection coating or the like by the suppressor, it becomes feasible to achieve good energy transfer characteristics in the entire visual field or in the entire illumination field for the light of the wide wavelength region.

In the optical apparatus of the present invention, the suppressor may be formed on another optical surface different from the aforementioned optical surface in the optical apparatus.

In the optical apparatus of the present invention, the suppressor may be a thin film laid on the another optical surface.

Further, in the optical apparatus of the present invention, the optical characteristic of the thin film is preferably one of the reflectance and the transmittance.

In the optical apparatus of the present invention, a wavelength characteristic of the reflectance of said suppressor is preferably a characteristic having a first region in which the first derivative of the wavelength characteristic is positive, on the short wavelength side and a region in which the second derivative of said wavelength characteristic is negative, in a second region on the longer wavelength side of said first region.

The inventors have conducted extensive and intensive research and found that the conventional thin films of optical apparatus had such a characteristic for the obliquely incident rays in comparison with the characteristic for the normally incident rays that the reflectance on the long wavelength side tended to increase more than the reflectance on the short wavelength side. By employing the above construction of the present invention, the reflectance characteristic of the suppressor becomes one to increase the reflectance on the short wavelength side and decrease the reflectance on the long wavelength side as incidence of rays varies from normal incidence to oblique incidence. This makes it feasible to attain the good energy transfer characteristics in the entire visual field or in the entire illumination field for the light of the wide wavelength region.

In the optical apparatus of the present invention, the predetermined wavelength band is defined preferably in the vicinity to a region between the first region and the second region and more preferably between the first region and the second region.

In the optical apparatus of the present invention, it is preferable to satisfy the following relation:

$$0.05 \leq \lambda/\Delta\lambda \tag{1},$$

where $\lambda$ is a center wavelength of the predetermined wavelength band and $\Delta\lambda$ is a width of the predetermined wavelength band. In this case, the width $\Delta\lambda$ of the predetermined wavelength band is further preferably not less than 10 nm.

In the optical apparatus of the present invention, a maximum angle of incident angles of rays incident to the another optical surface on which said suppressor is provided, may be not less than 5°.

Exposure apparatus of the present invention is exposure apparatus for transferring a predetermined pattern formed on a mask under illumination, onto a work, the exposure apparatus comprising the above optical apparatus.

Since the exposure apparatus of the present invention incorporates the optical apparatus capable of achieving the good energy transfer throughout the entire visual field or throughout the entire illumination field for the light of the wide wavelength region as described above, an illuminance distribution can be substantially uniform on the work.

The exposure apparatus of the present invention may be one comprising a light source for supplying illumination light, wherein the light source supplies the illumination light including at least two bright lines and wherein the at least two bright lines are in the predetermined wavelength band. In this case, the light source is preferably a discharge lamp and the light source is more preferably a mercury lamp.

The exposure apparatus of the present invention may be one comprising an illumination optical system for illuminating the mask on the basis of illumination light from a light source, and a projection optical system for forming a pattern image of the mask on the work, wherein the suppressor is provided in at least either one of the illumination optical system and the projection optical system.

An exposure method of the present invention is characterized in that the pattern on the mask is formed on the work by use of the exposure apparatus of the present invention.

Since the exposure method of the present invention employs the optical apparatus capable of achieving the good energy transfer throughout the entire visual field or throughout the entire illumination field for the light of the wide wavelength region as described above, the illuminance distribution can be substantially uniform on the work.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will be more particularly described with reference to the accompanying drawings, in which.

DESCRIPTION OF THE PREFERRED EMBODIMENTS

Figure 1:
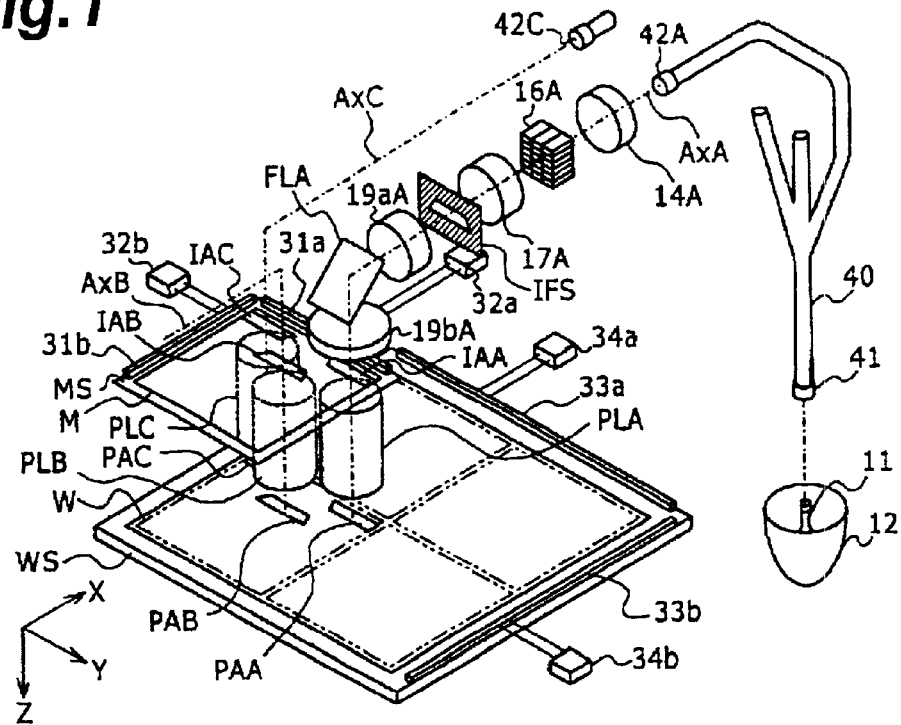
FIG. 1 is a diagram to schematically show a projection exposure apparatus of the present invention.

Preferred embodiments of the optical apparatus, exposure apparatus, and exposure method according to the present invention will be described below in detail. In FIG. 1, a mask M and a work W are placed along the XY plane and the following description will be given on the basis of the coordinate system in which the X-direction is taken along the direction of scan in the XY plane, the Y-direction along the non-scan direction perpendicular to the X-direction, and the Z-direction along the direction perpendicular to the XY plane.

A projection exposure apparatus of the present embodiment is constructed to illuminate a plurality of illumination areas IAA, IAB, IAC on the mask M by an illumination system described hereinafter and form erect normal images of patterns of the mask M in the respective illumination areas IAA to IAC, in corresponding projection areas PAA, PAB, PAC on the work W by a plurality of projection optical systems PLA, PLB, PLC placed corresponding to the respective illumination areas IAA to IAC.

As shown in FIG. 1, the projection areas PAA to PAC are of a trapezoid shape in a plan view and are arranged in parallel along the Y-direction so that the adjoining areas along the Y-direction (for example, PAA and PAB, PAB and PAC) are displaced from each other by a predetermined distance in the X-direction in the figure and so that edge portions of the adjoining areas overlap with each other in the Y-direction. The projection optical systems PLA to PLC are also arranged to be displaced from each other by the predetermined amount in the X-direction and overlap with each other in the Y-direction according to the arrangement of the projection areas PAA to PAC.

These projection areas PAA to PAC scan the surface of the work W, thereby substantially simultaneously forming an exposure area by the projection area PAA, an exposure area by the projection area PAB, and an exposure area by the projection area PAC on the work W.

A mask stage MS is movable in the X-direction by means of a driving device not illustrated. Moving mirrors 31a, 31b are installed in orthogonal arrangement at the edges on the mask stage MS. A laser interferometer 32a is arranged to face the moving mirror 31a. A laser interferometer 32b is arranged to face the moving mirror 31b.

These laser interferometers 32a, 32b emit their respective laser beams toward the corresponding moving mirrors 31a, 31b and measure distances to the moving mirrors 31a, 31b, whereby the apparatus can detect a moving distance in the X-direction of the mask stage MS and a rotation amount of the mask stage MS during the scan. The apparatus is also constructed to monitor the position of the mask stage MS, based on the output of the laser interferometers 32a, 32b, and perform servo control of the above driving device, so as to be able to move the mask stage MS to a desired position.

A work stage WS is movable in the X-direction, in the Y-direction, and in the Z-direction by driving means not illustrated. Moving mirrors 33a, 33b are installed in orthogonal arrangement at the edges on the work stage WS. A laser interferometer 34a is arranged to face the moving mirror 33a, while a laser interferometer 34b is arranged to face the moving mirror 33b.

These laser interferometers 34a, 34b emit their respective laser beams toward the corresponding moving mirrors 33a, 33b and measure distances to the moving mirrors 33a, 33b, whereby the apparatus can detect X-directional and Y-directional moving distances of the work stage WS, and a rotational amount of the work stage WS during the scan. Then the apparatus is constructed to monitor the position of the work stage WS, based on the output of the laser interferometers 34a, 34b, and perform servo control of the above driving means, so as to be able to move the work stage WS to a desired position.

An illumination system of the present embodiment will be described below. As illustrated in FIG. 1, the illumination system of the present embodiment is provided with one light source 11, a lightguide 40 for branching light from the light source 11 into three beams, and a plurality of illumination optical systems for guiding the beams from the exit ends of the lightguide 40 along respective optical axes AxA, AxB, AxC to the illumination areas IAA to IAC on the mask M.

FIG. 1 shows only two exit ends 42A, 42C out of the plurality of exit ends of the lightguide 40 and also shows only one illumination optical system arranged along the optical axis AxA out of the plurality of illumination optical systems. It is, however, noted that the plurality of exit ends of the lightguide 40 are also placed on the optical axes AxB, AxC and that the illumination optical systems equivalent to that arranged along the optical axis AxA are also placed on these optical axes AxB, AxC.

Figure 2:
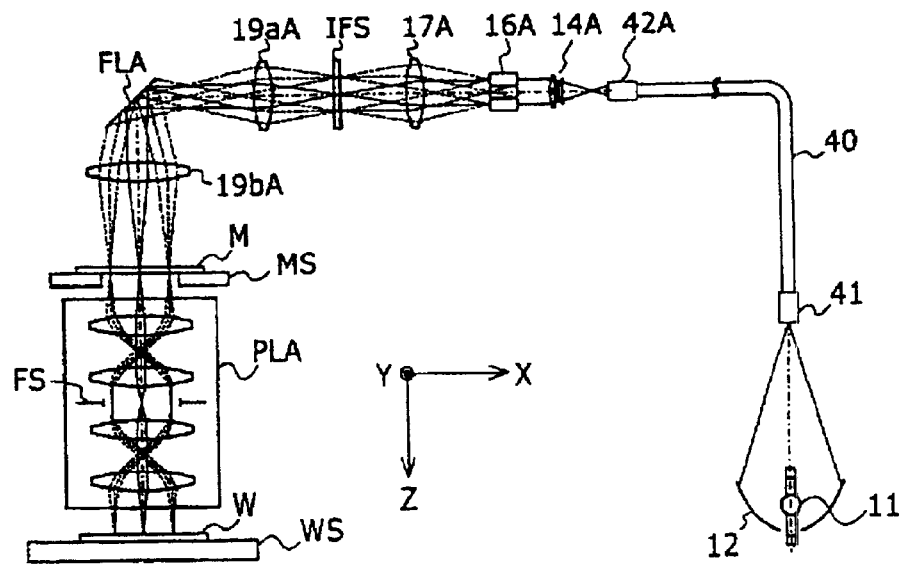
FIG. 2 is an optical path diagram of the projection exposure apparatus illustrated in FIG. 1.

FIG. 2 is an optical path diagram of the illumination optical system placed along the optical axis AxA. In the following description, the illumination optical system placed along the optical axis AxA will be described as a typical example and the description will be omitted for the illumination optical systems concerning the optical axes AxB, AxC.

In FIG. 2, the light source 11, which is comprised, for example, of an extra-high pressure mercury lamp or the like and which supplies light including three bright lines of g-line (436 nm), h-line (405 nm), and i-line (365 nm), is located at a first focus position of an ellipsoidal mirror 12, and the light from the light source 11 is converged at a second focus position of the ellipsoidal mirror 12 to form a light source image at this position. An entrance end 41 of the lightguide 40 is positioned and fixed near the second focus position of the ellipsoidal mirror 12. This lightguide 40 consists of a random bundle of optical fibers whose entrance ends are bundled into one and whose exit ends are bundled as plural exit portions (three ends in the present embodiment). Accordingly, the light incident to the entrance end 41 of the lightguide 40 emerges as substantially equal beams from the three exit ends (among which only the exit end 42A is illustrated in FIG. 1).

The light emerging from the exit end 42A of the lightguide 40 travels through an input lens unit 14A the front focal point of which is positioned near the exit end 42A, to be converted into a nearly parallel beam. This parallel beam is incident to a fly's eye lens 16A, whereby a surface illuminant (secondary light source) is formed on the exit plane of the fly's eye lens 16A. An illumination aperture stop not illustrated is placed at this secondary light source position.

The light from the secondary light source is condensed by a condenser lens system 17 the front focal point of which is positioned at the position where the secondary light source is formed, and superimposedly illuminates an illumination field stop IFS having an aperture of an isosceles trapezoid shape substantially similar to the shape of the illumination area IAA (the projection area PAA).

The beam having passed through the illumination field stop IFS travels through an IFS imaging optical system 19aA, 19bA for keeping the illumination field stop IFS optically conjugate with the pattern surface of the mask M (the surface of the work W) and via a path bending mirror FLA placed in the IFS imaging optical system, onto the mask M. At this time, the illumination area IAA is formed as an image of the aperture of the illumination field stop IFS on the mask M.

Although the present embodiment uses the three projection optical systems, the number of projection optical systems (the number of illumination areas or the number of projection areas) is not limited to three; for example, it is possible to use plural sets of projection optical systems, including five sets, seven sets, and so on. Further, the present embodiment is arranged to branch the light from one light source into the plurality of beams, but the number of light source is not limited to one; for example, it is also possible to adopt such configurations that light from a plurality of light sources is branched into a plurality of beams, as disclosed in U.S. Pat. Nos. 5,661,837, and 6,051,842, the teachings of which are hereby incorporated by reference. The projection optical systems in the present embodiment can be selected, for example, from those disclosed in Japanese Patent Applications Laid-Open No. H11-329935 and 200-39557, and disclosed in U.S. Pat. Nos. 5,805,356 and 6,157,497, the teaching of which are hereby incorporated by reference.

In the present embodiment, the antireflection coatings (suppressors) having the characteristic described below are provided on several lens surfaces out of those on the work W side of the fly's eye lens 16A (16B, 16C), and the conventional antireflection coatings on the lens surfaces except for them.

Figure 3:
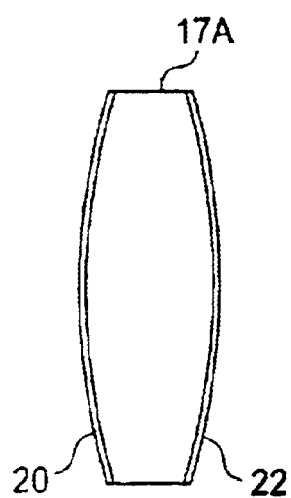
FIG. 3 is an enlarged view to show a condenser lens used in the projection exposure apparatus of FIG. 1.

For example, as illustrated in FIG. 3, a conventional antireflection coating 22 is laid on the lens surface (optical surface) 22 on the light source 11 side of the condenser lens 17A, while an antireflection coating 20 as a suppressor is laid on the other lens surface thereof. The conventional antireflection coating 22 is a thin film with an optical characteristic having wavelength dependence and the antireflection coating 20 is a thin film to suppress the above wavelength dependence of the antireflection coating 22 in a predetermined wavelength region, or in other words, thin film for correcting the wavelength dependence.

Figure 4:
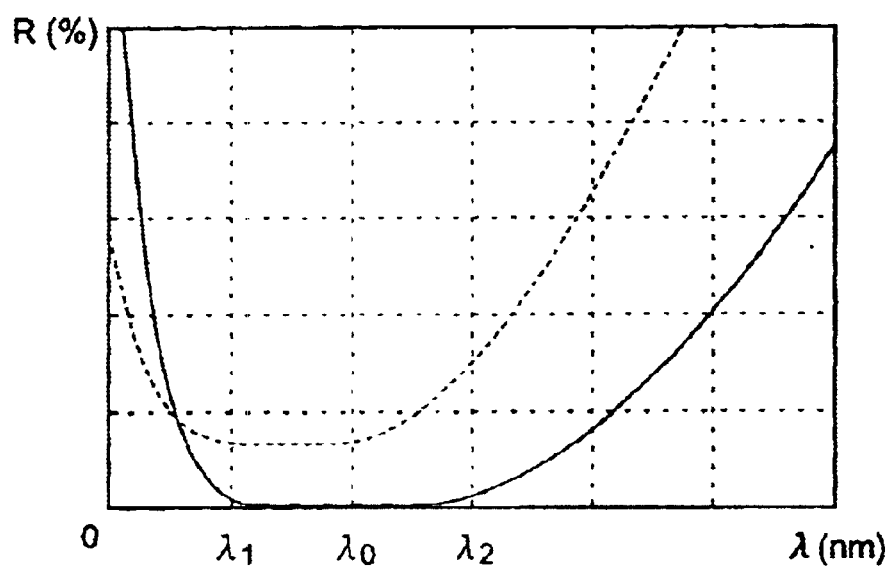
FIG. 4 is a diagram to show optical characteristics of an antireflection coating used in the conventional optical apparatus.

Now referring to FIG. 4, the optical characteristic (wavelength characteristic of reflectance) of the antireflection coating 22 formed on the conventional lenses will be described first, prior to the description of the antireflection coating 20 used in the present embodiment. In FIG. 4, the axis of ordinates represents the reflectance R (%) and the axis of abscissas the wavelength λ (nm). In the figure a solid line indicates the characteristic for normally incident rays to the antireflection coating 22 and a dashed line the characteristic for obliquely incident rays to the thin film. Further, $\lambda_0$ represents a reference wavelength, $\lambda_1$ a wavelength on the short wavelength side in the working wavelength region, and $\lambda_2$ a wavelength on the long wavelength side in the working wavelength region. As indicated by the solid line in FIG. 4, the conventional antireflection coating 22 had the wavelength characteristic to reduce the reflectance to the smallest possible level in the working wavelength region.

Then the inventors noted that with the antireflection coating having the simply flat characteristic as illustrated in FIG. 4, the reflectance at the long wavelength $\lambda_2$ tended to increase more than the reflectance at the short wavelength $\lambda_1$, because the characteristic for the obliquely incident rays was shifted to the shorter wavelength side from the characteristic for the normally incident rays.

There are not only the normally incident rays but also the obliquely incident rays at the position where the antireflection coating 22 is provided on the condenser lens 17A. Such obliquely incident rays correspond to rays reaching the marginal part in the field. Accordingly, the antireflection coating 22 demonstrates reflectances greatly different depending upon wavelengths in the marginal part in the field. The inventors found that this property caused the energy transfer unevenness such as the transmittance unevenness or the like in the entire field for the light of the wide wavelength region in the conventional lenses.

Figure 5:
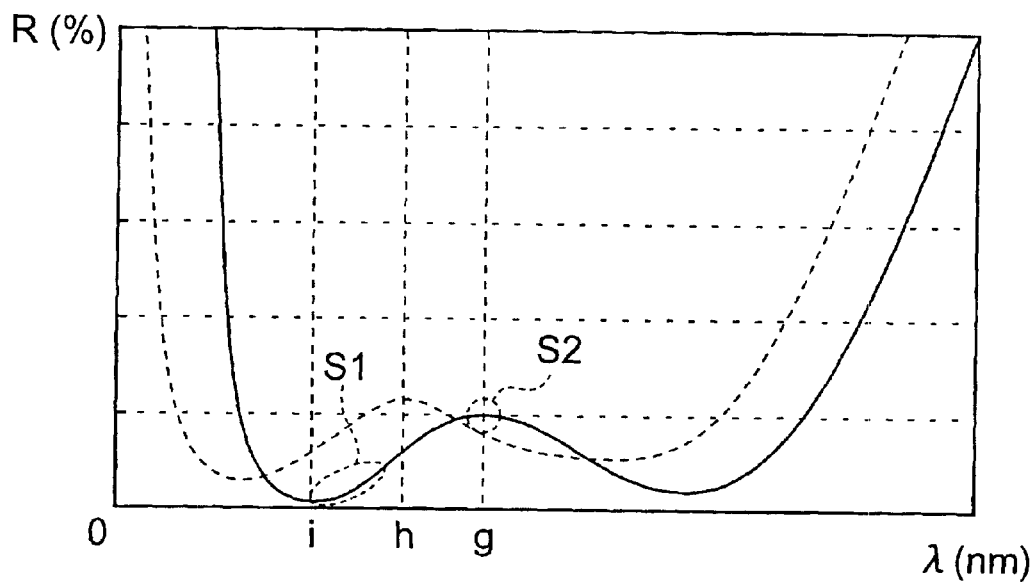
FIG. 5 is a diagram to show optical characteristics of an antireflection coating (suppressor) used in the optical apparatus of the present invention.

FIG. 5 is a diagram to show the reflectance characteristic of the antireflection coating 20 of the present embodiment.

In FIG. 5, the axis of ordinates represents the reflectance R (%) and the axis of abscissas the wavelength λ (nm). In FIG. 5, a solid line indicates the characteristic for normally incident rays to the antireflection coating and a dashed line the characteristic for obliquely incident rays to the thin film. Further, i indicates the i-line (λ=365 nm), h the h-line (λ=405 nm), and g the g-line (λ=436 nm).

As illustrated in FIG. 5, the reflectance characteristic of the antireflection coating of the present embodiment has a first region S1 in which the first derivative of the reflectance characteristic is positive, on the short wavelength side and a second region S2 in which the second derivative of the reflectance characteristic is negative, on the longer wavelength side of the first region S1. In the present embodiment the working wavelength region (g-line to i-line) is set near the region between these first region S1 and second region S2. Here it is most preferable to set the working wavelength region between the first region S1 and the second region S2.

In other words, the reflectance characteristic of the antireflection coating 20 is the characteristic to increase the reflectance on the short wavelength side and decrease the reflectance on the long wavelength side with variation in incidence of rays from normal incidence to oblique incidence. Namely, the characteristic is one in which the reflectance is kept as low as possible for normal incidence on the short wavelength side and in which the reflectance for normal incidence on the long wavelength side is greater than those at wavelengths around the wavelength of interest.

When the antireflection coating 20 set with the above characteristic is applied to part of lens surfaces of optical apparatus provided with the conventional antireflection coating 22 as illustrated in FIG. 3, it becomes feasible to cancel out the characteristic in which the reflectance on the long wavelength side increases more than the reflectance on the short wavelength side with the variation in incidence to oblique incidence as in the conventional antireflection coating 22. This means that the antireflection coating 20 can suppress the wavelength dependence of the antireflection coating 22.

This antireflection coating 20 can be fabricated by well-known thin film forming methods. Such thin film forming methods are described, for example, in "Thin Film Optical Filters," H. A. MacLeod, 3rd ed., IOP Publishing.

Figure 6:
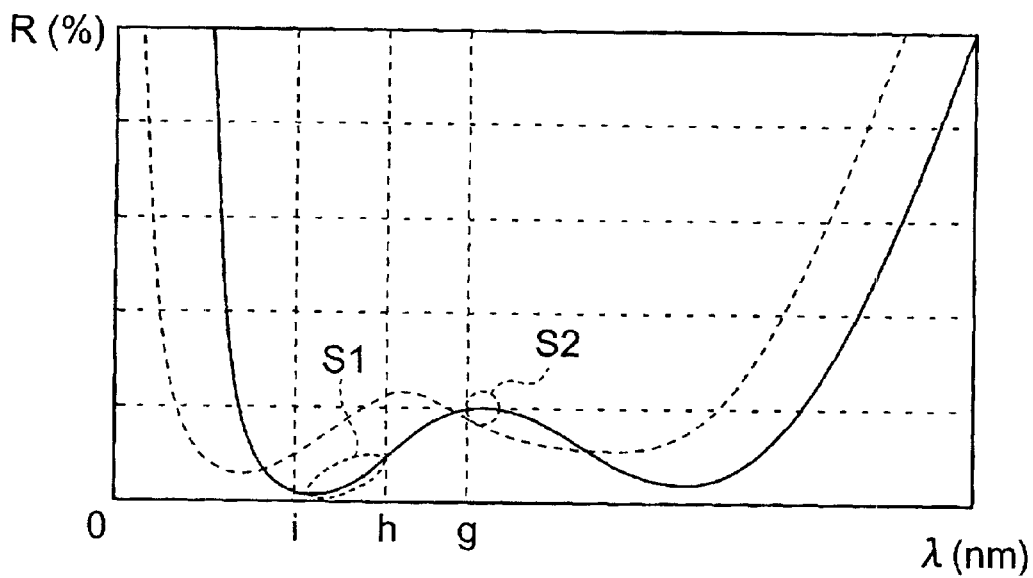
FIG. 6 is a diagram to show a case in which the working wavelength region in FIG. 5 is shifted.

It also becomes feasible to attain a practical effect and expand the working wavelength region, by setting the short wavelength edge of the working wavelength region a little on the short wavelength side over the first region S1 and set the long wavelength edge of the working wavelength region a little on the short wavelength side over the second region, as illustrated in FIG. 6. As in this case, the both edges of the working wavelength region do not have to match with the positions of extremes of the curve indicating the reflection characteristic, but they can be located near the first region S1 and near the second region S2. Specifically, they can be located in the region of ±3% of the wavelength at each extreme and preferably in the range of ±2% of the wavelength. For example, where the extreme of the first region S1 is 365 nm, the lower limit of the working wavelength region can be set in the range of 365±11 nm as ±3% of the wavelength.

Figure 7:
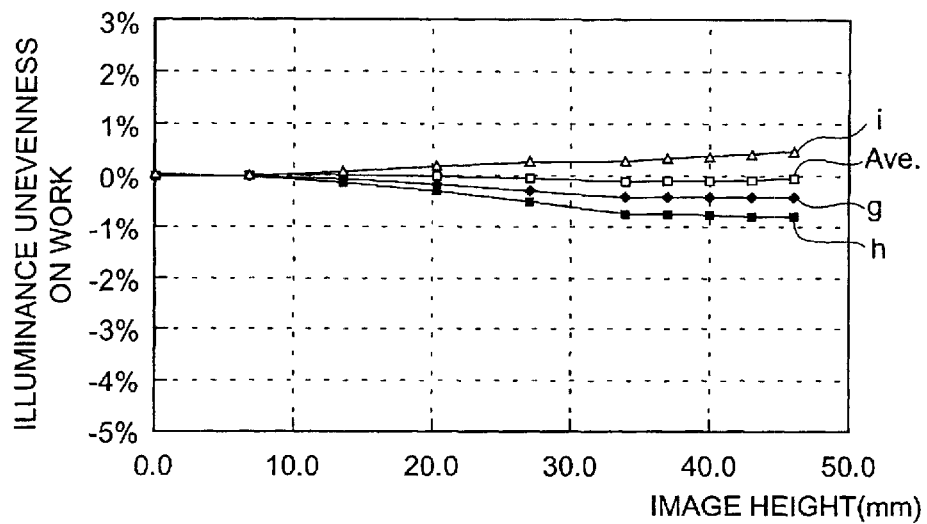
FIG. 7 is a diagram to show an illuminance distribution on a work in a case wherein the antireflection coating having the reflectance characteristic illustrated in FIG. 5 is applied to part of the optics in the exposure apparatus illustrated in FIG. 1 and FIG. 2.
Figure 8:
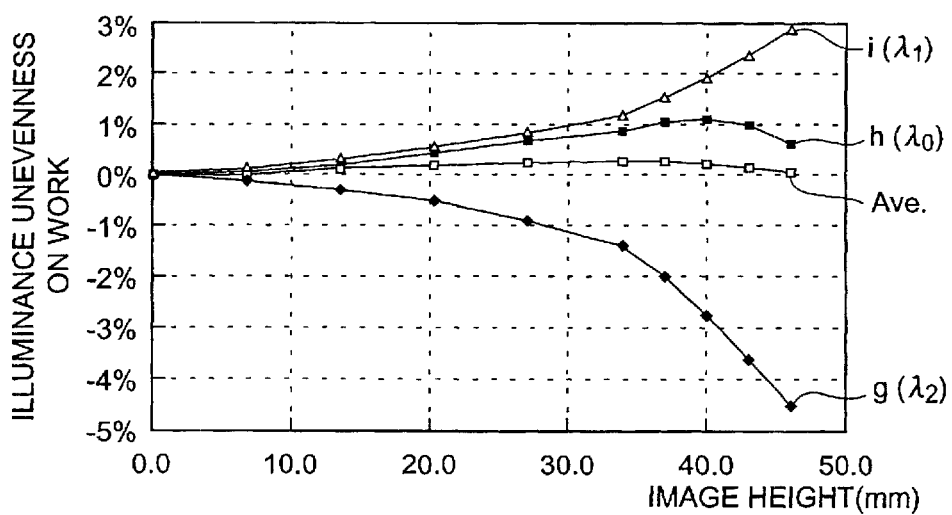
FIG. 8 shows an illuminance distribution on a work in a case wherein the antireflection coating having the reflectance characteristic illustrated in FIG. 4 is applied to the exposure apparatus illustrated in FIG. 1 and FIG. 2.

The results of comparison between the present embodiment and a conventional example will be described below with reference to FIG. 7 and FIG. 8. FIG. 7 shows an illuminance distribution on the work W in a case wherein the antireflection coating 22 with the reflectance characteristic illustrated in FIG. 5 is applied to part of the lens surfaces of the optics in the exposure apparatus illustrated in FIG. 1 and FIG. 2 (the rest lens surfaces being provided with the conventional reflectance characteristic (FIG. 4)), and FIG. 8 shows an illuminance distribution on the work W in a case wherein the antireflection coating with the reflectance characteristic illustrated in FIG. 4 is applied to all the lens surfaces of the optics in the exposure apparatus illustrated in FIG. 1 and FIG. 2. FIG. 7 and FIG. 8 show the illuminance distributions obtained on the work when the mask M has a uniform transmittance distribution.

In FIG. 7 and FIG. 8, the axis of ordinates represents illuminance unevenness (%) and the axis of abscissas image height on the work. In FIG. 7 and FIG. 8, i represents the i-line, h the h-line, g the g-line, and Ave. an average for all the wavelengths (provided that weights are given for the respective wavelengths).

As apparent from FIG. 2, when comparison is made between off-axis rays indicated by dashed lines and forming images at positions off the optical axis and on-axis rays indicated by solid lines and forming an image at the position on the optical axis, the off-axis rays include obliquely incident rays to the refracting surfaces in an overwhelmingly greater ratio than the on-axis rays do.

Accordingly, when the optics are constructed using only the antireflection coatings with the characteristic in which the reflectance on the long wavelength side increases more than the reflectance on the short wavelength side with variation in incidence to the oblique incidence, i.e., using only the conventional antireflection coatings 22, differences become greater among uneven illuminances at the respective wavelengths and the illuminance unevenness becomes great on the image plane, depending upon the wavelengths, as illustrated in FIG. 8.

On the other hand, when the antireflection coating with the reflectance characteristic as illustrated in FIG. 5 is applied to part of the lens surfaces, an image can be obtained with substantially uniform illuminance throughout the entire working wavelength region (i-line, h-line, and g-line), as illustrated in FIG. 7. When exposure is conducted using the exposure apparatus of the present embodiment as described, the illuminance distribution can be made substantially uniform on the work.

In the present embodiment, it is preferable to satisfy the following relation:

$$0.05 \leq \Delta\lambda/\lambda \tag{1},$$

where λ is a center wavelength of the working wavelength region as the predetermined wavelength band and Δλ is a width of the working wavelength region.

This Condition (1) defines an effective range of the suppression technique according to the present embodiment. If the width of the working wavelength region does not satisfy Condition (1), the inevitability of employing this suppression technique will be low.

The antireflection coating with the characteristic as illustrated in FIG. 5 is preferably provided on an optical surface (a refractive surface, a reflective surface, a diffractive surface, or the like) to which rays are incident in the angular range of not less than 5°. It is not preferable to provide the conventional antireflection coating on such an optical surface with the angular range of not less than 5°, because influence will become too great from illumination unevenness due to incident angle dependence of transmittance. When there is a possibility of causing illumination unevenness by over correction of the wavelength characteristic of the conventional antireflection coating, the antireflection coating of the present embodiment does not have to be provided on all the optical surfaces with the angular range of not less than 5°, but may be provided on some of the optical surfaces.

Figure 9:
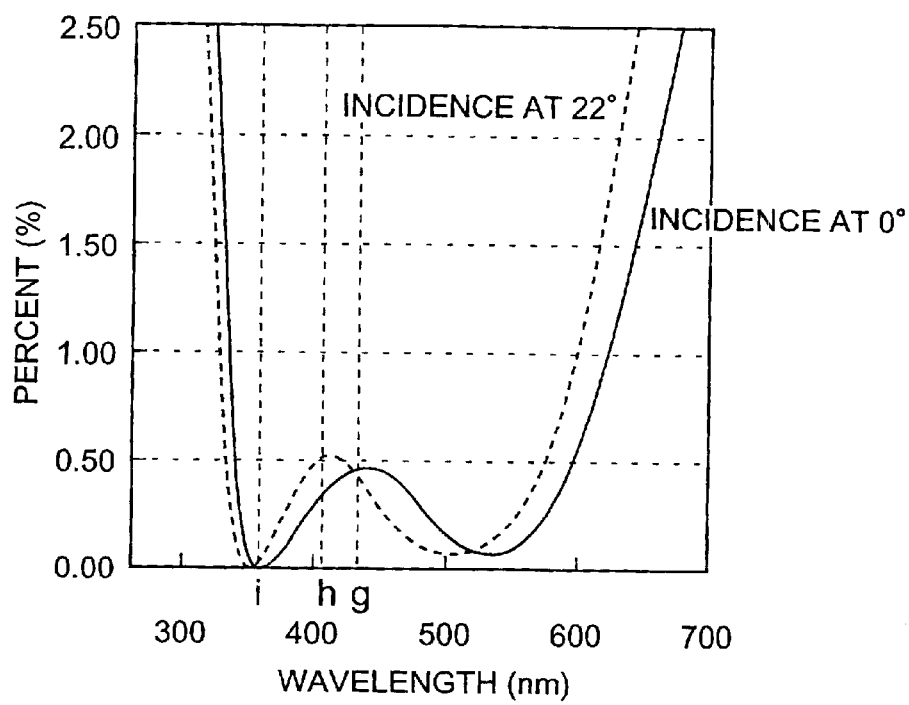
FIG. 9 is a diagram to show the relation between wavelength and reflectance of actual incident rays in an optical apparatus (lens) of the present invention.

FIG. 9 is a diagram to show the relation between wavelength and reflectance of actually incident rays to the lens with the antireflection coating 22 on one surface thereof and with the antireflection coating 20 on the other surface. The maximum incident angle of oblique incidence was 22°. As illustrated in the same figure, the reflectances are approximately equal between normal incidence and oblique incidence both on the short wavelength side (near the i-line) and on the long wavelength side (near the g-line).

The above example showed the application of the present invention to the antireflection coating, but the present invention can also be applied to reflection-enhancing coatings, as well as the antireflection coatings. In this case, however, where R represents the reflectance in the reflectance characteristic of the reflection-enhancing coatings, the reflectance characteristic of (1−R) can be set to be the aforementioned wavelength characteristic.

When the projection exposure apparatus in the above embodiment is used in the lithography step of fabrication to fabricate display devices such as liquid crystal display devices, plasma display panels (PDPs), and so on, a glass substrate is used as the work W. The projection exposure apparatus in the above embodiment can be applied to the lithography steps of various use including the lithography step of fabricating semiconductor devices using a wafer as the work W, the lithography step of fabricating magnetic heads, using a substrate of a bar shape called a raw bar as the work W, the lithography step of a printed wiring board using a resin substrate of epoxy resin or the like as the work W, and so on.

In the above embodiment the projection optical systems PL were those to form the erect normal image in the magnification of 1, but the magnification of the projection optical systems can be either a reduction ratio or an enlargement ratio.

In the above embodiment, the optical integrators were the fly's eye lenses to form a plurality of light source images of real images, but the optical integrators can be internal reflection type integrators (rod type integrators, optical pipes, or optical tunnels) to form a plurality of light source images of virtual images.

A device fabrication method will be described below. The following will describe a fabrication method employed for fabricating a liquid crystal display device as a microdevice by forming a predetermined circuit pattern on a plate (glass substrate). An example of operations in this case will be described below with reference to the flowchart of FIG. 10.

Figure 10:
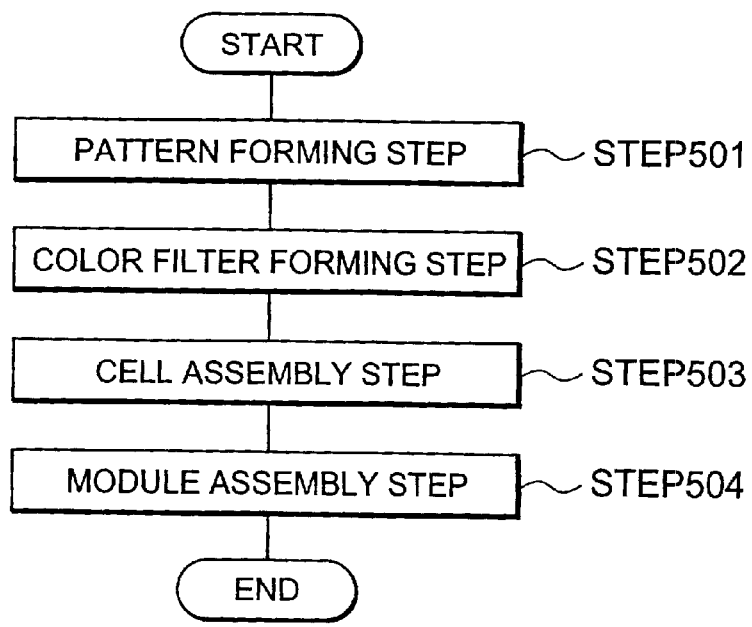
FIG. 10 is a flowchart to show an example of a device fabrication method.

In FIG. 10, a pattern forming step 501 is a step of carrying out a so-called photolithography step to print a pattern of a mask onto a photosensitive substrate as a work (e.g., a glass substrate coated with a resist) by use of the exposure apparatus of the above embodiment. This photolithography step results in forming the predetermined pattern including many electrodes and others, on the photosensitive substrate.

After that, the exposed substrate is processed through each of steps including a development step, an etching step, a reticle removing step, and so on, whereby a predetermined pattern is formed on the substrate. Then the process transfers to a next color filter forming step 502.

The next color filter forming step 502 is a step of forming a color filter in which many sets of three dots corresponding to R (Red), G (Green), and B (Blue) are arrayed in a matrix pattern. After completion of the color filter forming step 502, a cell assembly step 503 is carried out.

In the cell assembly step 503, a liquid crystal panel (liquid crystal cell) is assembled using the substrate with the predetermined pattern formed in the pattern forming step 501, the color filter obtained in the color filter forming step 502, and so on. In the cell assembly step 503, the liquid crystal panel (liquid crystal cell) is fabricated, for example, by charging a liquid crystal into the space between the substrate with the predetermined pattern obtained in the pattern forming step 501 and the color filter obtained in the color filter forming step 502.

After that, a module assembly step 504 is carried out to complete a liquid crystal display device by mounting various components including an electric circuit for display operation of the liquid crystal panel (liquid crystal cell) thus assembled, a back light, and so on.

Since the above fabrication method can adequately reduce occurrence of illumination unevenness due to the wide wavelength band in spite of increase of exposure power using the exposure light in the wide wavelength band, for example, of the g-line to i-line, it is feasible to obtain highly accurate patterns with high throughput and to fabricate excellent devices (semiconductor devices, liquid crystal display devices, thin film magnetic heads, etc.) even with increase in the size of the work.

The embodiments described above are presented only for the purpose of clarifying the technical essence of the present invention, but the present invention should not be interpreted in a narrow sense of limitation to the above embodiments. The present invention can involve various changes and modifications within the spirit of the present invention and the scope of the claims which follow.

As described above, the present invention can accomplish the good energy transfer characteristics (reflectance characteristics or transmittance characteristics) throughout the entire visual field or throughout the entire illumination field for the light of the wide wavelength region.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An optical apparatus, comprising:
   an optical surface;
   a thin film having an optical characteristic of wavelength dependence, which is formed on the optical surface; and
   a suppressor arranged in an optical path of the optical apparatus to suppress the wavelength dependence in a predetermined wavelength band,
   wherein the suppressor has a reflectance characteristic of increasing reflectance on a short wavelength side of a working wavelength region and decreasing reflectance on a long wavelength side of the working wavelength region, and light rays incident on the optical surface include normal incident rays and oblique incident rays.

2. The optical apparatus according to claim 1, wherein the suppressor is formed on another optical surface different from the optical surface in the optical apparatus.

3. The optical apparatus according to claim 2, wherein the suppressor is a thin film laid on the other optical surface.

4. The optical apparatus according to claim 1, wherein the optical characteristic of the thin film is one of reflectance and transmittance.

5. The optical apparatus according to claim 1, wherein the wavelength characteristic of the reflectance of the suppressor has a first region in which the first derivative of the wavelength characteristic is positive on the short wavelength side of the working wavelength region, and a second region in which the second derivative of the wavelength characteristic is negative on the longer wavelength side of the first region.

6. The optical apparatus according to claim 5, wherein the predetermined wavelength band is defined between the first region and the second region.

7. The optical apparatus according to claim 1, wherein the following relation is satisfied:

$$0.05 \leq \Delta\lambda/\lambda,$$

where $\lambda$ is a center wavelength of said predetermined wavelength band and $\Delta\lambda$ is a width of said predetermined wavelength band.

8. An exposure apparatus for transferring a predetermined pattern, formed on a mask under illumination, onto a workpiece, the exposure apparatus comprising the optical apparatus of claim 1.

9. The exposure apparatus according to claim 8, further comprising a light source for supplying illumination light, wherein the light source supplies the illumination light including at least two bright lines, and wherein the at least two bright lines are in the predetermined wavelength band.

10. The exposure apparatus according to claim 8, further comprising an illumination optical system for illuminating the mask, based on illumination light from a light source, and a projection optical system for forming an image of the pattern of the mask on the workpiece, wherein the suppressor is provided in at least one of the illumination optical system and the projection optical system.

11. An exposure method of transferring a predetermined pattern formed on a mask onto a workpiece, using the exposure apparatus of claim 8.

12. An exposure apparatus for transferring a predetermined pattern, formed on a mask under illumination, onto a workpiece, comprising:

a light source;

an illumination optical system arranged in an optical path between the light source and the mask;

a projection optical system arranged in an optical path between the mask and the workpiece;

a thin film having an optical characteristic of wavelength dependence, the thin film being formed on an optical surface arranged in at least one of the optical paths; and a suppressor, arranged in at least one of the optical paths, having a reflectance characteristic of increasing reflectance on a short wavelength side of a working wavelength region and decreasing reflectance on a long wavelength side of the working wavelength region, the suppressor suppressing the wavelength dependence in a predetermined wavelength range.

13. The exposure apparatus according to claim 12, wherein the suppressor is formed on another optical surface different from the optical surface in the at least one of the optical paths.

14. The exposure apparatus according to claim 13, wherein the suppressor is a thin film laid on the other optical surface.

15. The exposure apparatus according to claim 14, wherein the optical characteristic of the thin film is one of reflectance and transmittance.

16. The exposure apparatus according to claim 12, wherein the predetermined wavelength range includes a wavelength of an illumination light.

17. An exposure method of transferring a predetermined pattern, formed on a mask under illumination, onto a workpiece, comprising:

providing a light from a light source;

illuminating the mask with the light from the light source;

projecting the pattern on the mask onto the workpiece;

passing the light through a thin film with an optical characteristic having wavelength dependence; and passing the light through a suppressor, wherein the thin film is formed on an optical surface in an optical path between the light source and the workpiece, and wherein the suppressor suppresses the wavelength dependence in a predetermined wavelength range and has a reflectance characteristic of increasing reflectance on a short wavelength side of a working wavelength region and decreasing reflectance on a long wavelength side of the working wavelength region.

18. The method according to claim 17, wherein the predetermined wavelength range includes a wavelength of an illumination light.

19. The method according to claim 17, wherein the optical characteristic of the thin film is one of reflectance and transmittance.

20. An optical apparatus, comprising:

an optical surface;

a thin film with an optical characteristic having wavelength dependence, the thin film being formed on the optical surface; and a suppressor arranged in an optical path of the optical apparatus and having a reflectance characteristic of increasing reflectance on a short wavelength side of a working wavelength region and decreasing reflectance on a long wavelength side of the working wavelength region.

21. The optical apparatus according to claim 20, wherein the suppressor is formed on another optical surface different from the optical surface in the optical apparatus.

22. The optical apparatus according to claim 21, wherein the suppressor is a thin film laid on the another optical surface.

23. The optical apparatus according to claim 22, wherein the optical characteristic of the thin film is one of reflectance and transmittance.

24. An exposure apparatus for transferring a predetermined pattern, formed on a mask under illumination, onto a workpiece, comprising the optical apparatus according to claim 20.

* * * * *

UNITED STATES PATENT AND TRADEMARK OFFICE
CERTIFICATE OF CORRECTION

PATENT NO. : 6,750,951 B2
DATED : June 15, 2004
INVENTOR(S) : Motoo Koyama et al.

It is certified that error appears in the above-identified patent and that said Letters Patent is hereby corrected as shown below:

<u>Title page,</u>
Item [30], Foreign Application Priority Data, please add:

-- April 10, 2001     (JP)     P2001-110910 --.

Signed and Sealed this

Seventh Day of December, 2004

JON W. DUDAS
*Director of the United States Patent and Trademark Office*